United States Patent
Wan et al.

(10) Patent No.: US 11,894,236 B2
(45) Date of Patent: Feb. 6, 2024

(54) METHOD FOR MANUFACTURING SEMICONDUCTOR STRUCTURE

(71) Applicant: CHANGXIN MEMORY TECHNOLOGIES, INC., Anhui (CN)

(72) Inventors: Qiang Wan, Hefei (CN); Jun Xia, Hefei (CN); Kangshu Zhan, Hefei (CN); Tao Liu, Hefei (CN); Penghui Xu, Hefei (CN); Sen Li, Hefei (CN); Yanghao Liu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 241 days.

(21) Appl. No.: 17/669,555

(22) Filed: Feb. 11, 2022

(65) Prior Publication Data
US 2023/0005750 A1    Jan. 5, 2023

Related U.S. Application Data

(63) Continuation of application No. PCT/CN2021/120994, filed on Sep. 27, 2021.

(30) Foreign Application Priority Data

Jul. 1, 2021  (CN) .......................... 202110744675.7

(51) Int. Cl.
| | |
|---|---|
| *H01L 21/308* | (2006.01) |
| *H01L 21/02* | (2006.01) |
| *H01L 21/027* | (2006.01) |
| *H10B 12/00* | (2023.01) |

(52) U.S. Cl.
CPC ...... *H01L 21/3086* (2013.01); *H01L 21/0228* (2013.01); *H01L 21/0273* (2013.01); *H10B 12/03* (2023.02); *H10B 12/30* (2023.02)

(58) Field of Classification Search
CPC ............. H01L 21/3086; H01L 21/0228; H01L 21/0273; H10B 12/03; H10B 12/30
See application file for complete search history.

(56) References Cited

U.S. PATENT DOCUMENTS 9,455,177 B1 *  9/2016  Park ................... H01L 21/31144
9,607,885 B2 *  3/2017  Zhang ................. H01L 23/5226
(Continued)

FOREIGN PATENT DOCUMENTS

CN    113035836 A    6/2021

*Primary Examiner* — Binh X Tran
(74) *Attorney, Agent, or Firm* — Cooper Legal Group, LLC

(57) ABSTRACT

A method for manufacturing a semiconductor structure includes: providing a base; forming multiple discrete first mask layers on the base; forming multiple sidewall layers, in which each sidewall layer is configured to encircle one of the first mask layers, and each sidewall layer is connected to closest sidewall layers, the side walls, away from the first mask layers, of multiple connected sidewall layers define initial first vias and each of the initial first vias is provided with chamfers; removing the first mask layers, and each sidewall layer defines a second via; after removing the first mask layers, forming repair layers which are located on the side walls, away from the second vias, of the sidewall layers and fill the chamfers of the initial first vias to form first vias; and etching the base along the first vias and the second vias to form capacitor holes on the base.

15 Claims, 22 Drawing Sheets

(56) References Cited

U.S. PATENT DOCUMENTS

| | | | |
|---|---|---|---|
| 2015/0104946 A1* | 4/2015 | Park | H01L 21/3088 438/703 |
| 2016/0064235 A1* | 3/2016 | Nam | H01L 21/31144 438/703 |
| 2016/0254153 A1* | 9/2016 | Park | H01L 21/76843 438/695 |
| 2017/0053802 A1* | 2/2017 | Park | H01L 21/32139 |
| 2019/0051654 A1* | 2/2019 | Chang | H10B 12/0335 |

* cited by examiner

METHOD FOR MANUFACTURING SEMICONDUCTOR STRUCTURE

CROSS-REFERENCE TO RELATED APPLICATIONS

This application is a continuation application of International application No. PCT/CN2021/120994, filed on Sep. 27, 2021, which claims priority to Chinese Patent Application No. 202110744675.7, filed on Jul. 1, 2021. The disclosures of International application No. PCT/CN2021/120994 and Chinese Patent Application No. 202110744675.7 are hereby incorporated by reference in their entireties.

BACKGROUND

Dynamic random access memory (DRAM) is a kind of semiconductor memory widely used in computer systems, the main function principle of which is to represent binary bits by the amount of charges stored in capacitors.

Self-aligned Double Patterning (SADP) is usually adopted to form capacitors in the related art. Generally, a two-layer mask pattern is required to be formed, both two layers of the mask pattern include trench structures spaced apart from each other, and when observed from top view, the two layers of the mask pattern are oblique to each other. Then, the two-layer mask pattern is transferred to a target mask layer to define a capacitor hole pattern and capacitors are manufactured. However, due to the loading effect during etching, the SADP process is prone to causing problems such as different capacitor sizes, different heights, insufficient etching and reduced capacitor storage capacity, thereby reducing the yield of the semiconductor structure.

SUMMARY

The disclosure relates to a method for manufacturing a semiconductor structure.

Embodiments of the disclosure provide a method for manufacturing a semiconductor structure, to improve the yield of the semiconductor structure.

The embodiments of the disclosure provide the method for manufacturing a semiconductor structure, including the following operations, in which a base is provided; multiple discrete first mask layers are formed on the base; multiple sidewall layers are formed, in which each sidewall layer is configured to encircle one of the first mask layers, each sidewall layer is connected to closest sidewall layers, and the side walls, away from the first mask layers, of multiple connected sidewall layers define initial first vias, and each of the initial first vias is provided with chamfers; the first mask layers are removed, and each sidewall layer defines a second via; after removing the first mask layers, repair layers are formed, which are located on side walls, away from the second vias, of the sidewall layers, and further fill in the chamfers of the initial first vias to form first vias; and the base is etched along the first vias and the second vias to form capacitor holes, which are located in the base.

According to some embodiments, the first vias are arranged in a square mode, the second vias are arranged in a square mode, and each first via is adjacent to four second vias.

According to some embodiments, forming first mask layers and sidewall layers includes the following operations, in which a second mask layer is formed on the base, and the second mask layer are provided with multiple discrete third vias; first sidewall layers are formed on side walls of the third vias, and the first sidewall layers define second vias; after forming the first sidewall layers, the second mask layer are removed; after removing the second mask layer, the first mask layers are formed, which fill the second vias; after forming the first mask layers, second sidewall layers are formed on the side walls, away from the first mask layers, of the first sidewall layers, the second sidewall layers are connected to the closest second sidewall layers, and the side walls, away from the first mask layers, of multiple connected second sidewall layers define initial first vias; and the first sidewall layers and the second sidewall layers constitute the sidewall layers.

According to some embodiments, the material of first mask layers includes photoresist, and forming the first mask layers includes the following operations, in which a photoresist layer is formed, which is located between the adjacent first sidewall layers and fully fills the second vias; exposure treatment and development treatment are performed on the photoresist layer to remove the photoresist layer located between the adjacent first sidewall layers, and the remaining photoresist layer in the second vias serves as the first mask layers.

According to some embodiments, forming first sidewall layers includes the following operations, in which an initial first sidewall layer is formed, which is located on side walls and bottoms of the third vias and a top surface of the second mask layer; and the initial first sidewall layer located on the top surface of the second mask layer and at the bottoms of the third vias are removed, and the remaining initial first sidewall layer serves as the first sidewall layers.

According to some embodiments, a process of forming the initial first sidewall layer comprises an atomic layer deposition (ALD) process.

According to some embodiments, a material of first sidewall layers is the same as that of second sidewall layers.

According to some embodiments, the width of first sidewall layers is smaller than that of the second sidewall layers in the direction perpendicular to the side walls of the sidewall layers.

According to some embodiments, forming the repair layers includes the following operations, in which an initial repair layer is formed, which covers the surfaces of the sidewall layers and further covers the base between adjacent the sidewall layers; and the initial repair layer covering the base is removed, and the remaining initial repair layer serves as the repair layers.

According to some embodiments, a process for forming the initial repair layer comprises an ALD process.

According to some embodiments, a material of repair layers is the same as that of sidewall layers.

According to some embodiments, a width of the repair layers is smaller than that of sidewall layers in the direction perpendicular to the side walls of the sidewall layers.

According to some embodiments, the base includes an isolation layer and a third mask layer which are stacked, in which the third mask layer has a multi-layer structure, including a third lower mask layer, a third middle mask layer and a third upper mask layer which are stacked. Forming capacitor holes includes the following operations, in which parts of the third upper mask layer and parts of the third middle mask layer are etched with sidewall layers and repair layers as a mask, so as to form a patterned third upper mask layer and a patterned third middle mask layer; parts of the third lower mask layer are etched with the patterned third upper mask layer and the patterned third middle mask layer as a mask, so as to form a patterned third lower mask layer;

and the isolation layer is etched with the patterned third lower mask layer as a mask to form the capacitor holes.

According to some embodiments, after forming capacitor holes, the method further includes that lower electrodes are formed, which are located at the bottoms and side walls of the capacitor holes.

According to some embodiments, an isolation layer includes a bottom support layer, a first sacrificial layer, an intermediate support layer, a second sacrificial layer and a top support layer which are stacked; and the capacitor holes penetrate through the bottom support layer, the first sacrificial layer, the intermediate support layer, the second sacrificial layer and the top support layer. After forming the lower electrodes, the method further includes the following operations, in which parts of the top support layer and parts of the intermediate support layer are removed, and the first sacrificial layer and the second sacrificial layer are removed to expose the lower electrodes; a dielectric layer is formed, which covers the surfaces of the lower electrodes; an upper electrode is formed, which covers the dielectric layer; and the upper electrode, the lower electrodes and the dielectric layer are configured to form capacitors; and a cover layer is formed, which is located on the surfaces of the upper electrode.

The embodiments of the disclosure provide a method for manufacturing a semiconductor structure. In the method, first mask layers are formed; each sidewall layer is configured to encircle the corresponding first mask layer, and the side walls, away from the first mask layers, of multiple connected sidewall layers define initial first vias, which are provided with chamfers; the first mask layers are removed, and each sidewall layer defines a corresponding second via; repair layers fill the chamfers of the initial first vias to form first vias; a base is etched along the first vias and the second vias to form capacitor holes. In other words, the sidewall layers are configured to define the positions of both the first vias and the second vias, therefore the distances between the first vias and the corresponding second vias are approximate to the width of the sidewall layers, in this way, the distances between the first vias and the corresponding second vias can be relatively consistent. In addition, the mask layers defining both of the first vias and the second vias are the sidewall layers, therefore the etching rate of the mask layers can be kept consistent. In addition, the first vias and the second vias are located in the same layer, thereby avoiding the problem of different etching aspect ratios caused by the etching loading effect when a capacitor hole pattern is defined by the SADP process. In addition, the repair layers can further remove the chamfers of the initial first vias to form relatively smooth first vias, and then form smooth capacitor holes, which is beneficial to avoid the phenomenon of tip discharge or electric leakage. Therefore, the embodiments of the disclosure can improve the quality of the capacitor holes, and further improve the yield of the semiconductor structure.

In addition, the material of the repair layers is the same as that of the sidewall layers, so that when the base is etched with the sidewall layers and the repair layers as a mask, the sidewall layers and the repair layers have the same etching rate, thereby ensuring the same consumption degree, and further ensuring that the finally formed capacitor holes are consistent in size and height.

BRIEF DESCRIPTION OF THE DRAWINGS

One or more embodiments are illustrated with reference to the figures in the corresponding drawings, which should not limit the embodiments. The same reference numerals designate the same elements in the drawings, and the figures in the drawings are not limited to scale unless otherwise defined.

DETAILED DESCRIPTION

Figure 1:
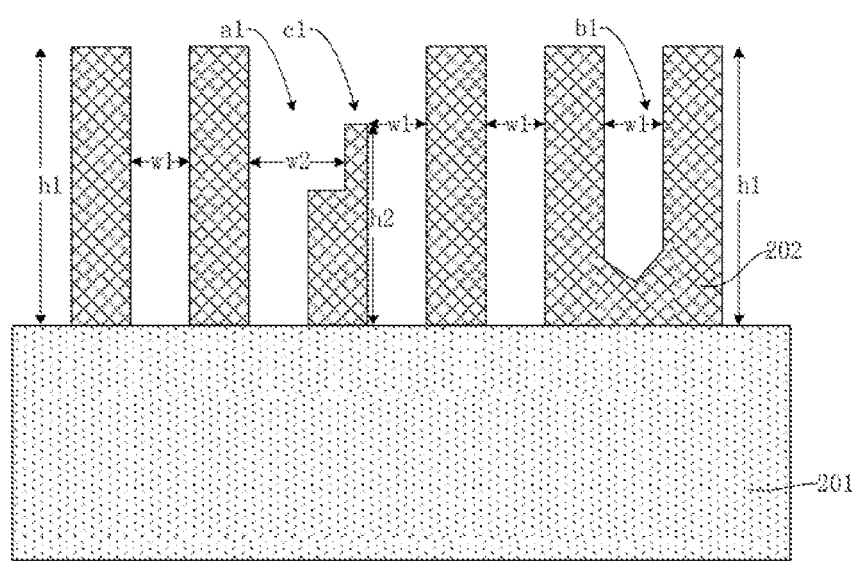
FIG. 1 illustrates a schematic structural diagram of a method for manufacturing a semiconductor structure.

As seen from the background, the yield of the semiconductor structure is low. With reference to FIG. 1, a substrate 201 and mask layer 202 on the substrate 201 are provided. The mask layer 202 is configured to transfer a capacitor hole pattern, and further, the substrate 201 is etched with the patterned mask layer 202 after the pattern transfer as a mask to form a capacitor hole structure. When the traditional double patterning technology, such as self-aligned double patterning (SADP) is adopted to define a capacitor hole, due to the loading effect, the patterned mask layer 202 after the pattern transfer have disadvantages of different sizes (as shown by a1 in FIG. 1), insufficient etching (as shown by b1 in FIG. 1), different heights (as shown by c1 in FIG. 1), etc. Therefore, capacitor holes formed after the capacitor pattern is transferred have corresponding disadvantages of different sizes, insufficient etching, different heights of the capacitors and absence of filling materials, such as GeSi material, in the capacitors in the subsequently stage, which leads to the reduced capacitor storage capacity or electrical failure, and further affects the wafer yield and seriously limits the possibility of further improving the storage capacity and stability of a capacitor memory. In FIG. 1, the width w1 is smaller than the width w2 and the height h2 is smaller than the height h1.

Figure 2:
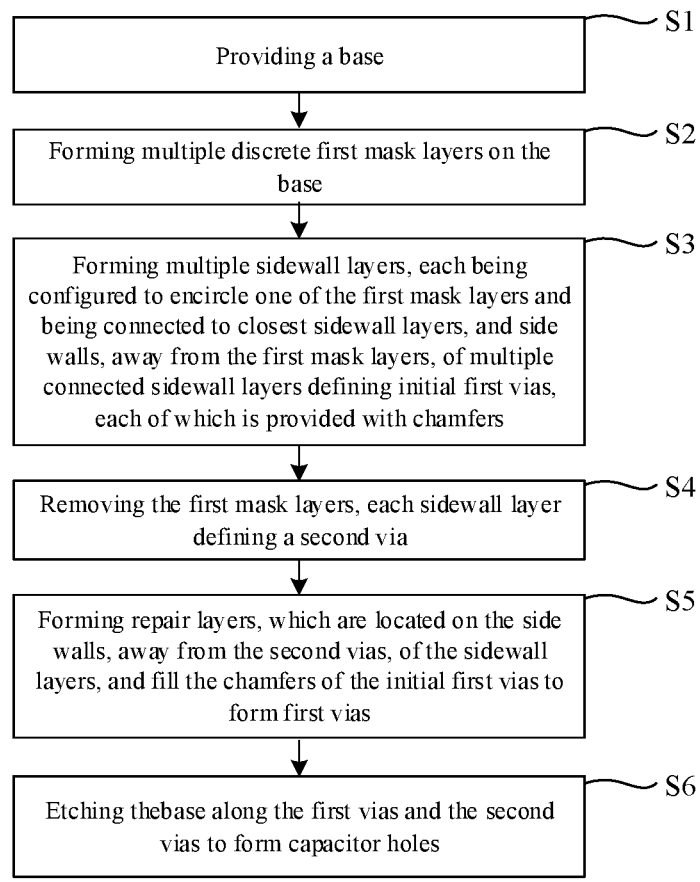
FIG. 2 illustrates a flowchart of a method for manufacturing a semiconductor structure according to an embodiment of the disclosure.

Embodiments of the disclosure provide a method for manufacturing a semiconductor structure. With reference to FIG. 2, the method for manufacturing the semiconductor structure includes the following operations: S1: providing a base; S2: forming multiple discrete first mask layers on the substrate; S3: forming multiple sidewall layers, each sidewall layer being configured to encircle the corresponding first mask layer, each sidewall layer being connected to the corresponding closest sidewall layers, and the side walls, away from the first mask layers, of the multiple connected sidewall layers defining initial first vias, each of which is provided with chamfers; S4: removing the first mask layers, and each sidewall layer defining a second via; S5: forming repair layers, which are located on the side walls, away from the second vias, of the sidewall layers, and fill the chamfers of the initial first vias to form first vias; and S6: etching the substrate along the first vias and the second vias to form capacitor holes. In other words, the sidewall layers are configured to define the positions of both the first vias and the second vias, therefore the distances between the first vias and the corresponding second vias are approximate to the width of the sidewall layers, in this way, the distances between the first vias and the corresponding second vias can be relatively consistent. In addition, the mask layers defining both the first vias and the second vias are the sidewall layers, therefore the etching rate of the mask layers can be kept consistent. In addition, the first vias and the second vias are located in the same layer, i.e., it is not necessary to transfer a pattern between upper and lower mask layers, therefore the pattern accuracy of the finally formed capacitor holes is improved. In addition, the repair layers may further be configured to remove the chamfers of the initial first vias to form relatively smooth first vias, and then form smooth capacitor holes, which is beneficial to avoid the phenomenon of tip discharge or electric leakage. Therefore, the embodiments of the disclosure can improve the quality of the capacitor holes, and further improve the yield of the semiconductor structure.

To make the objectives, technical solutions and advantages of the embodiments of the disclosure to be understood more clearly, the embodiments of the disclosure will be described in detail below with reference to the drawings. However, those of ordinary skill in the art should understand that, numerous technical details will be described in the embodiments of the disclosure to enable a reader to better understand the disclosure. However, even without the technical details and variations and modifications based on the following embodiments, the technical solutions claimed by the disclosure may further be implemented.

An embodiment of the disclosure provides a method for manufacturing a semiconductor structure. FIG. 2 illustrates a flowchart of the method for manufacturing the semiconductor structure according to the embodiment, and FIGS. 3-22 illustrate schematic structural diagrams of the operations of the method for manufacturing a semiconductor structure according to the embodiment. The method will be illustrated in detail below with reference to the drawings.

Figure 3:
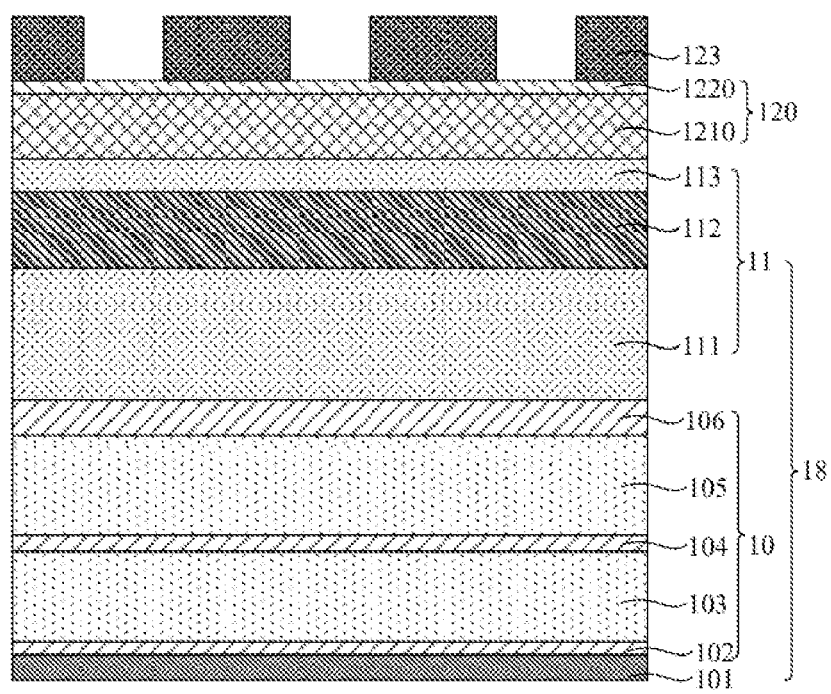
FIGS. 3-22 illustrate schematic structural diagrams of the operations of a method for manufacturing a semiconductor structure according to an embodiment of the disclosure.

With reference to FIGS. 2-3, at S1, a base 18 is provided, which may include a substrate 101 according to the embodiment. Specifically, the substrate 101 may be provided with structures such as word lines, bit lines, active areas, isolation structures and contact layers.

According to the embodiment, the base 18 may further include an isolation layer 10 and a third mask layer 11 which are stacked.

Specifically, with reference to FIG. 3, the isolation layer 10 is located on the substrate 101, and capacitors 17 (with reference to FIG. 22) are subsequently formed in the isolation layer 10, and the capacitors 17 may be electrically connected to active areas in the substrate 101 through structures such as contact layers. The isolation layer 10 may include a bottom support layer 102, a first sacrificial layer 103, an intermediate support layer 104, a second sacrificial layer 105 and a top support layer 106 which are stacked. The bottom support layer 102, the intermediate support layer 104 and the top support layer 106 are configured to support the capacitors 17.

The bottom support layer 102, the intermediate support layer 104 and the top support layer 106 have relatively large hardness and strength, therefore the stability of the capacitors 17 (with reference to FIG. 22) can be improved. In the embodiment, the material of the bottom support layer 102, the intermediate support layer 104 and the top support layer 106 may be silicon nitride. The first sacrificial layer 103 and the second sacrificial layer 105 will be removed after forming lower electrodes 171 of the capacitors 17 (with reference to FIG. 22), therefore the first sacrificial layer 103 and the second sacrificial layer 105 have a larger etching selection ratio relative to the bottom support layer 102, the intermediate support layer 104 and the top support layer 106. In the embodiment, the materials of the first sacrificial layer 103 and the second sacrificial layer 105 may be silicon oxide.

With further reference to FIG. 3 the third mask layer 11 may have a multi-layer structure, including a third lower mask layer 111, a third middle mask layer 112 and a third upper mask layer 113 which are stacked. The third mask layer 11 with the multi-layer structure can improve the accuracy of pattern transfer, thereby ensuring relatively good consistency of finally formed capacitor holes. The material of the third middle mask layer 112 is different from that of the third upper mask layer 113 and that of the third lower mask layer 111. In the embodiment, the material of the third middle mask layer 112 may be silicon oxide, and the materials of the third upper mask layer 113 and the third lower mask layer 111 may be polysilicon.

With reference to FIG. 2 and FIGS. 3 to 14, at S2, multiple discrete first mask layers 14 are formed on the base 18; and at S3, multiple sidewall layers 150 are formed, and each sidewall layer 150 is configured to encircle the corresponding first mask layer 14, each sidewall layer 150 is connected to the corresponding closest sidewall layers 150, and the side walls, away from the first mask layers 14, of the multiple connected sidewall layers 150 define initial first vias 193 provided with chamfers 194.

After repairing the initial first vias 193 subsequently, first vias 195 are formed (with reference to FIG. 18); and second vias 192 may be exposed after subsequently removing the first mask layers 14 (with reference to FIG. 15). The positions of the first vias 195 and the second vias 192 correspond to the positions of capacitor holes 196 (with reference to FIG. 21) subsequently formed in the base 18. It is not difficult to find that the sidewall layers 150 are configured to define the positions of both the first vias 195 and the second vias 192. Therefore, the distances between the first vias 195 and the corresponding second vias 192 are approximate to the width of the sidewall layers 150, in this way, the distances between the first vias 195 and the corresponding second vias 192 can be kept relatively consistent. Further, the first vias 195 and the second vias 192 are located in the same layer, i.e. the pattern transfer between the upper and lower mask layers is not required, thereby improving the pattern accuracy of the finally formed capacitor holes 196.

The operations of forming the first mask layers 14 and the sidewall layers 150 will be illustrated in detail below.

Figure 4:
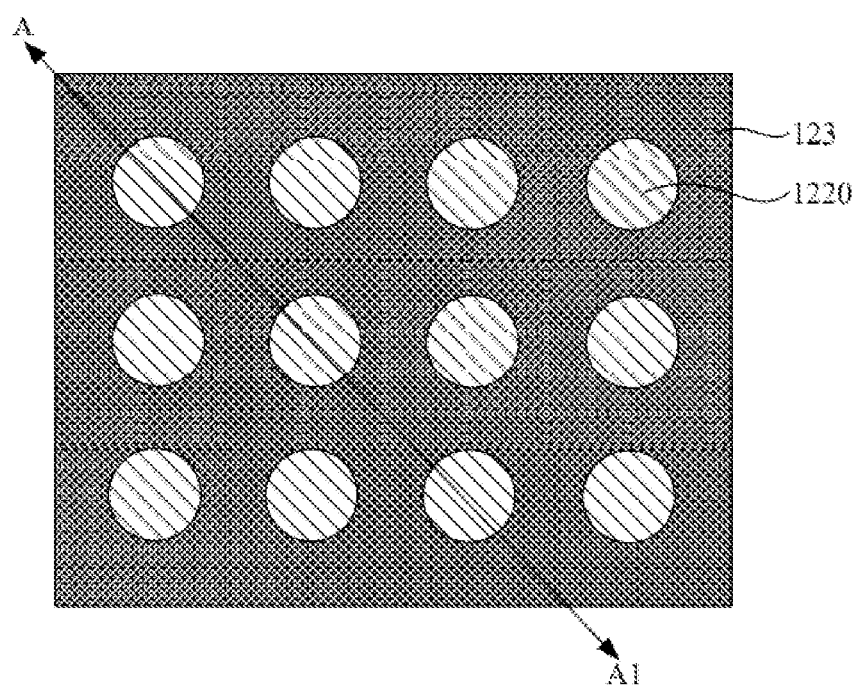
Figure 5:
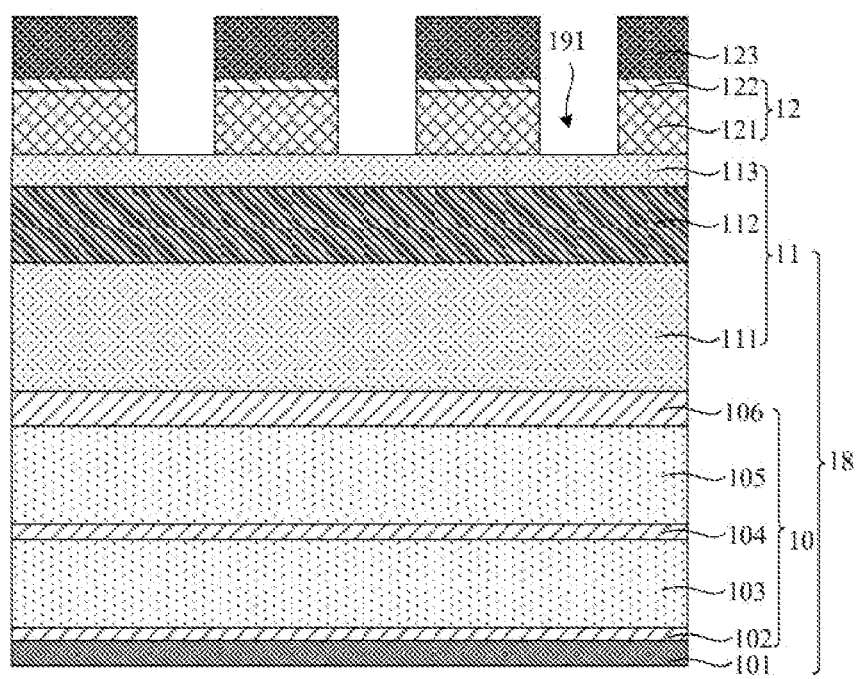

With reference to FIGS. 3-5, a second mask layer 12, which is provided with multiple discrete third vias 191, is formed on the base 18. Subsequently, the size of the third vias 191 may be adjusted to form second vias 192 (with reference to FIG. 7), and the size of the third vias 191 is larger than that of the second vias 192 in the direction perpendicular to the side wall of the base 18.

Specifically, with reference to FIGS. 3-4, FIG. 3 illustrates a cross-sectional diagram of FIG. 4 along the A-A1 direction. An initial second mask layer 120 and a first photoresist layer 123 which are stacked are formed on the base 18.

In the embodiment, the initial second mask layer 120 has a double-layer structure, including an initial lower second mask layer 1210 and an initial upper second mask layer 1220 which are stacked. The initial lower second mask layer 1210 can absorb the reflected light of photoetching, thereby reducing reflection and standing waves, and further improving the accuracy of pattern transfer. In other embodiments, the initial second mask layer 120 may also be a single-layer structure or another multi-layer structure. In the embodiment, the material of the initial lower second mask layer 1210 may be silicon carbide or silicon oxycarbide. The material of the initial upper second mask layer 1220 may further be silicon nitride or silicon oxynitride.

With reference to FIG. 5, the initial second mask layer 120 (with reference to FIG. 4) is etched to the third mask layer 11 with the first photoresist layer 123 as a mask, so as to transfer an initial circular mask pattern defined by a mask plate into the initial second mask layer 120. At this time, multiple third vias 191 exposing parts of the surface of the third mask layer 11 and a second mask layer 12 constituting by the remaining initial second mask layer 120 are formed. The second mask layer 12 includes a lower second mask layer 121 and an upper second mask layer 122 which are stacked. In the embodiment, the second mask layer 12 may be formed by dry etching.

Figure 6:
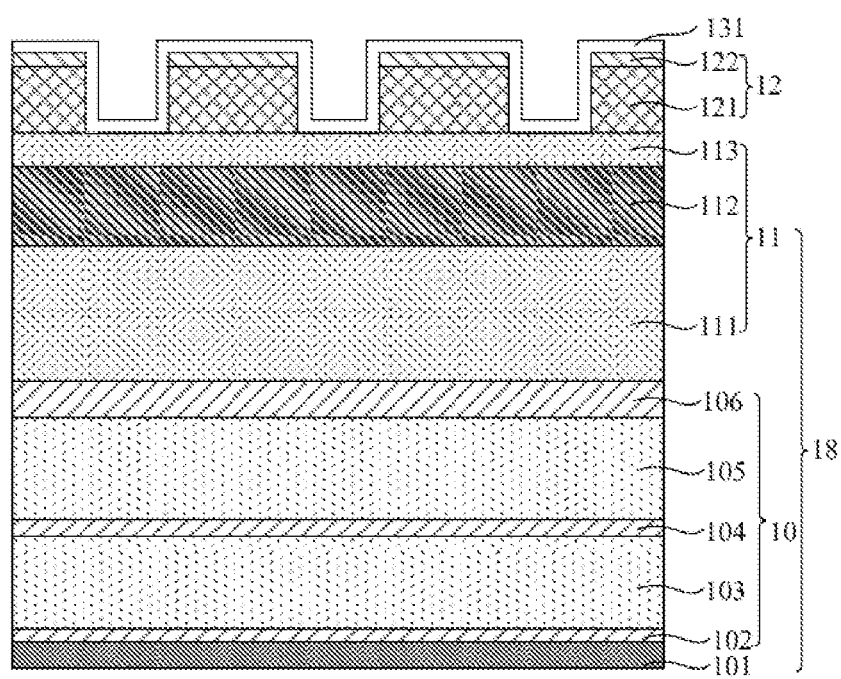
Figure 7:
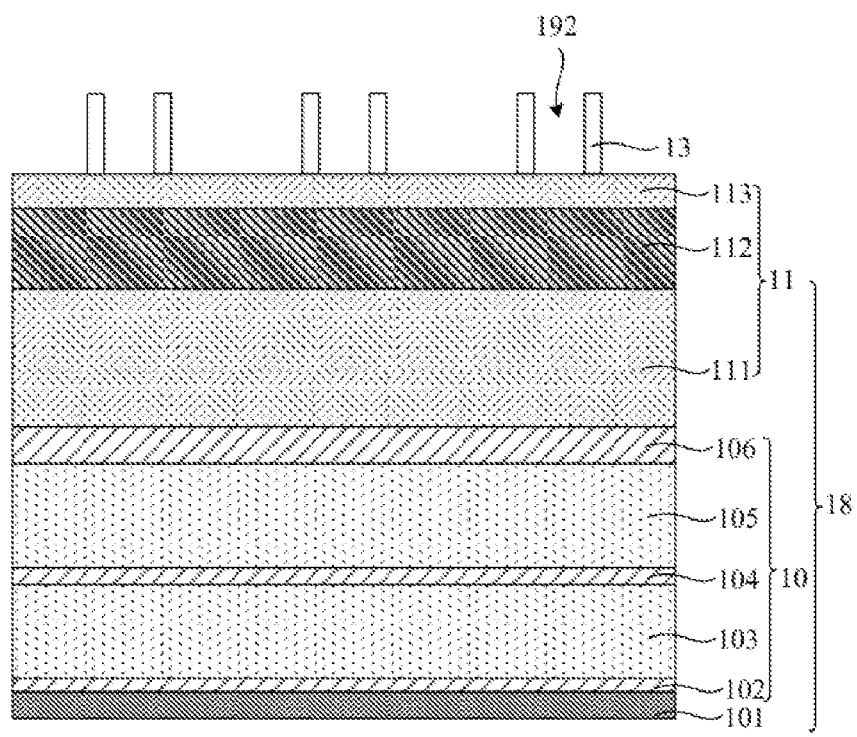
Figure 8:
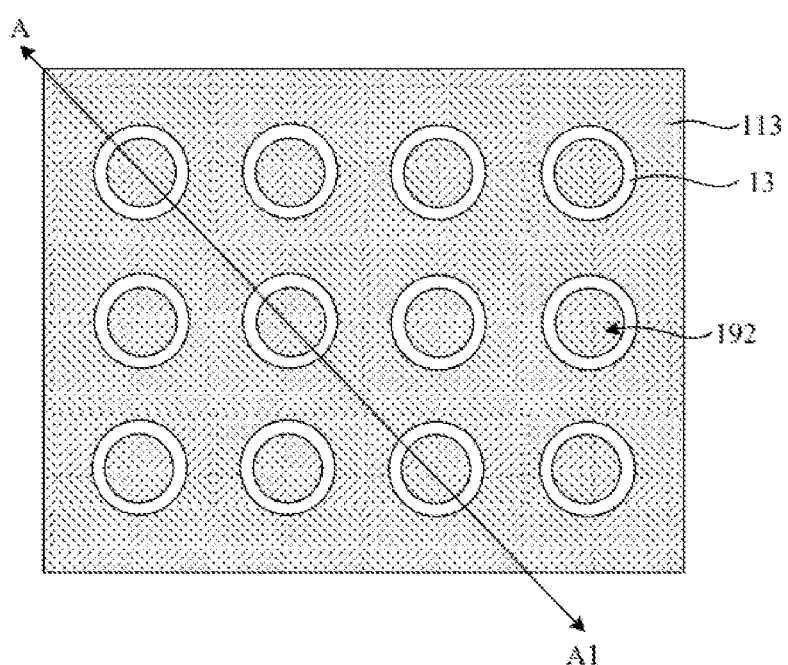

With reference to FIGS. 6-8, first sidewall layers 13 are formed on the side walls of the third vias 191 and the first sidewall layers 13 define the second vias 192. In the direction perpendicular to the side wall of the base 18, the first sidewall layers 13 can adjust the size of the third vias 191 more finely, thereby forming the second vias 192 with a more precise size, and ensuring the critical size of the capacitor holes 196 (with reference to FIG. 21) formed subsequently. In other embodiments, the positions of the second vias 192 may be defined directly by the second mask layer 12 without forming the first sidewall layers 13, i.e., the filling positions of the first mask layers 14 may be defined directly by the second mask layer 12.

In the embodiment, the material of the first sidewall layers 13 is silicon oxide. In other embodiments, the material of first sidewall layers 13 may be silicon nitride, silicon oxynitride or the like.

Specifically, with reference to FIG. 6, an initial first sidewall layer 131, which covers side walls and bottoms of the third vias 191 (with reference to FIG. 5) and top surface of the second mask layer 12 is formed, i.e., the initial first sidewall layer 131 covers the surfaces of the second mask layer 12 and the third vias 191.

In the embodiment, the initial first sidewall layer 131 is formed by atomic layer deposition (ALD) process. The initial first sidewall layer 131 formed by ALD process is relatively consistent in thickness and can improve the accuracy of the pattern of the second vias 192 subsequently formed. In other embodiments, the initial first sidewall layer 131 may further be formed by low pressure chemical vapor deposition (LPCVD) process.

With reference to FIGS. 7-8, FIG. 7 illustrates a cross-sectional diagram of FIG. 8 along the A-A1 direction. The initial first sidewall layer 131 located on the top surface of the second mask layer 12 and at bottoms of the third vias (with reference to FIG. 6)(with reference to FIG. 6) is removed, the remaining initial first sidewall layer 131 is configured as the first sidewall layers 13, and each first sidewall layer 13 defines one corresponding second via 192. Specifically, the initial first sidewall layer 131 is etched downward, at this time, the material of the initial first sidewall layer 131 deposited on the side walls of the second mask layer 12 (with reference to FIG. 6) remains to form the multiple first sidewall layers 13. The multiple first sidewall layers 13 are discrete. In the embodiment, the first sidewall layers 13 may be formed by dry etching.

In the embodiment, the second vias 192 are in circular shapes from cross-sectional view. In other embodiments, second vias 192 may further be in elliptical shapes from cross-sectional view. In the embodiment, the second vias 192 are arranged in a square mode, i.e. each second via 192 is adjacent to four second vias 192 except for the second vias 192 located at the edges. In other embodiments, second vias 192 may further be arranged in a hexagonal mode.

With further reference to FIGS. 7-8, after forming the first sidewall layers 13, the second mask layer 12 is removed (with reference to FIG. 6). In the embodiment, the second mask layer 12 is removed by dry etching. In other embodiments, the second mask layer 12 may further be removed by wet etching.

Figure 9:
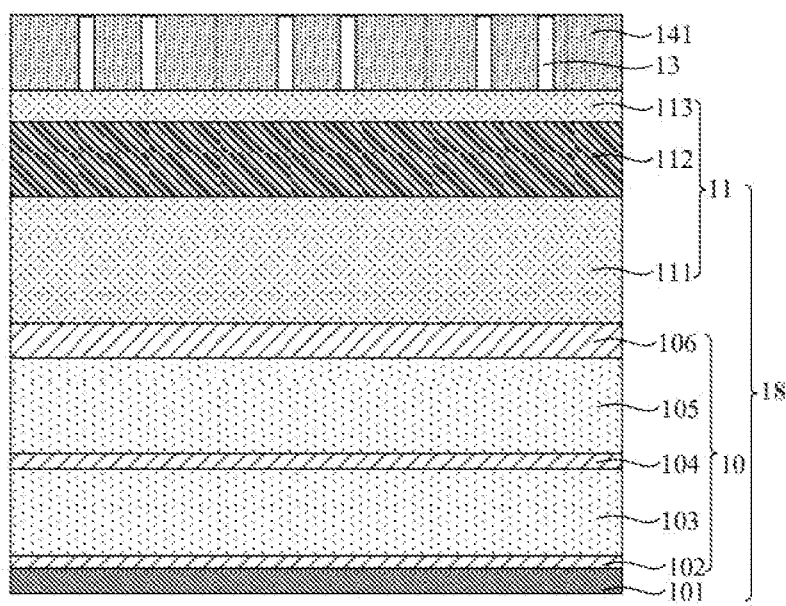
Figure 10:
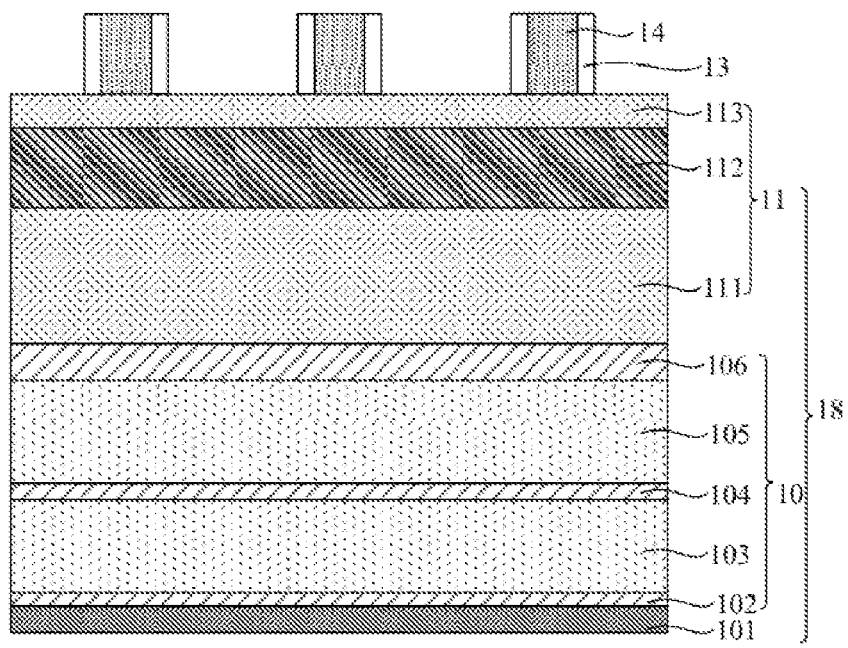
Figure 11:
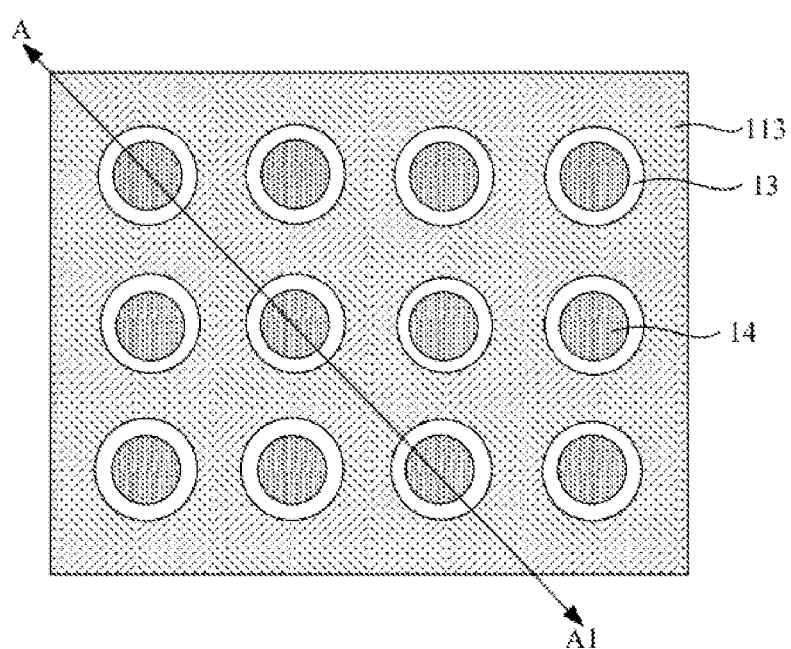

With reference to FIGS. 9-11, first mask layers 14 are formed to fill the second vias 192 (with reference to FIG. 8). In the embodiment, the material of the first mask layers 14 is photoresist. The difficulty of removing the photoresist is low, and the damages to the first sidewall layers 13 in the subsequent operation of removing the first mask layers 14 can be avoided, thereby improving the accuracy of the pattern of the finally formed capacitor holes 196. In other embodiments, the material of first mask layers 14 may be a hard mask material such as silicon nitride or silicon oxynitride.

Specifically, forming the first mask layers 14 includes, with reference to FIG. 9, that a photoresist layer 141, which is located between the adjacent first sidewall layers 13 and fully fills the second vias 192 (with reference to FIG. 8) is formed; and with reference to FIGS. 10-11, in which FIG. 10 illustrates a cross-sectional diagram along the A-A1 direction of FIG. 11, an exposure treatment and a development treatment are performed on the photoresist layer 141 (with reference to FIG. 9) to remove the photoresist layer 141 located between the adjacent first sidewall layers 13, and the remaining photoresist layer 141 in the second vias 192 serves as the first mask layers 14.

It should be understood that, in the embodiment, parts of the photoresist layer 141 may be removed by the exposure treatment and the development treatment with relatively few process operations and the damages to the first sidewall layers 13 may further be reduced. In other embodiments, the material of first mask layers 14 may further be a hard mask material such as silicon nitride or silicon oxynitride, and accordingly, parts of the first mask layers 14 may be removed by dry etching or wet etching.

Figure 12:
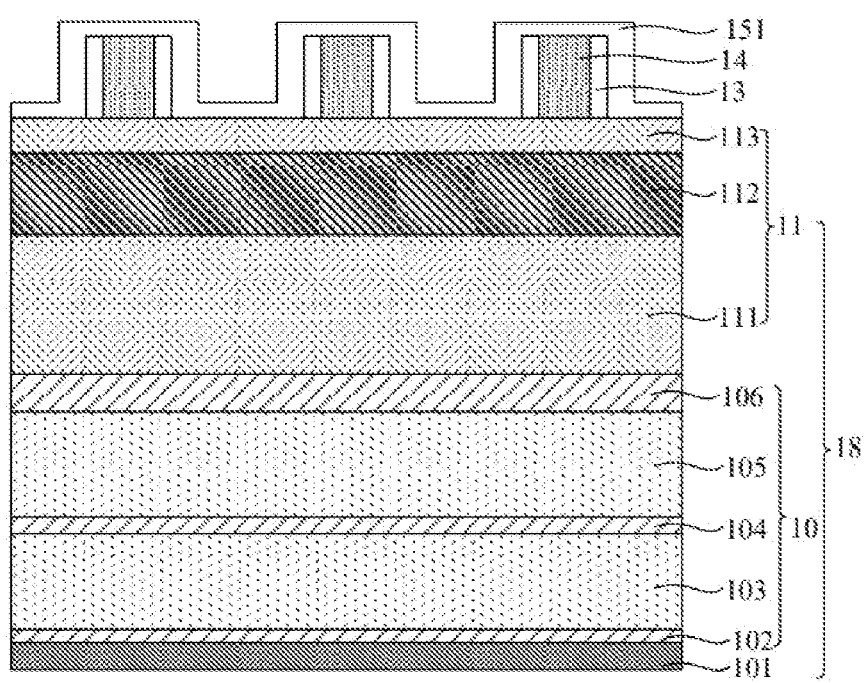
Figure 13:
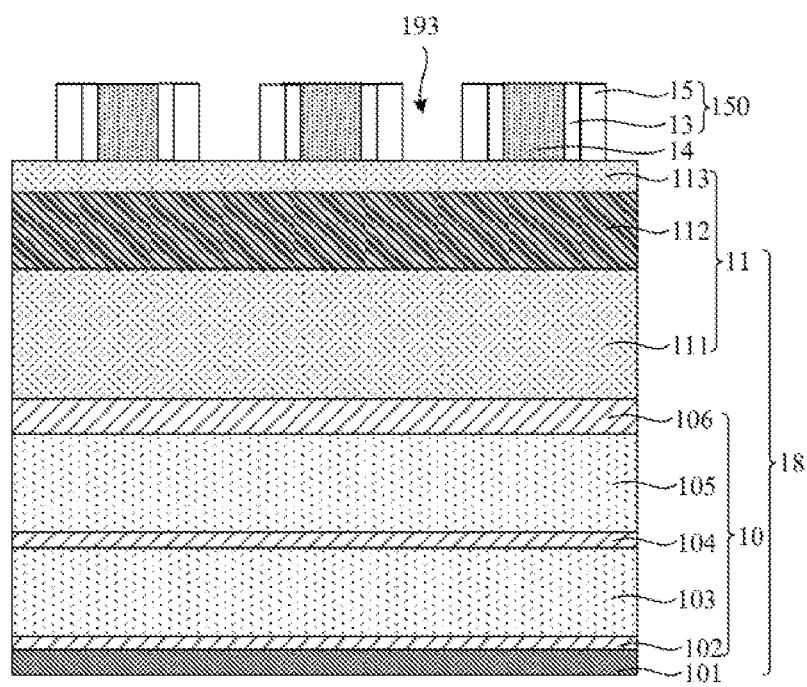
Figure 14:
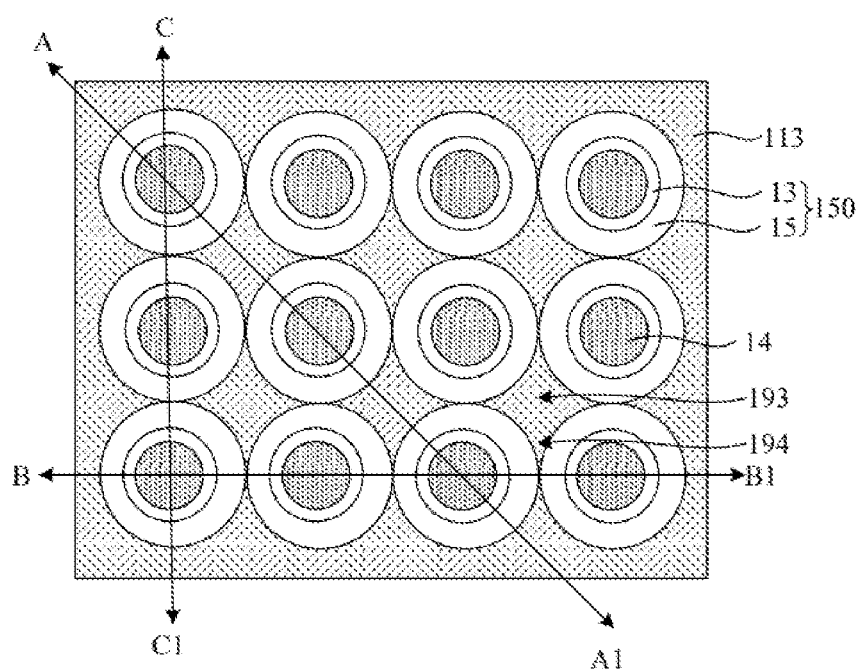

With reference to FIGS. 12-14, second sidewall layers 15 are formed on the side walls, away from the first mask layers 14, of the first sidewall layers 13. Each second sidewall layer 15 is connected to all the corresponding closest second sidewall layers 15, and the side walls, away from the side walls of the first mask layers 14, of multiple connected second sidewall layers 15 define the initial first vias 193. The first sidewall layers 13 and the second sidewall layers 15 are configured to form the sidewall layers 150. That is, the second sidewall layers 15 encircle the peripheries of the first sidewall layers 13 and are configured to increase the thickness of the first sidewall layers 13, therefore multiple first sidewall layers 13 are connected as a whole and define the initial first vias 193 with the chamfers 194.

According to the embodiment, with reference to FIG. 14, the adjacent second sidewall layers 15 are the closest to each other in the B-B1 direction and the C-C1 direction. In the B-B1 direction and the C-C1 direction, any second sidewall layer 15 is in contact with and connected to the corresponding second sidewall layers 15 that are the closest thereto. Every four connected second sidewall layers 15 define one initial first via 193. The distance between adjacent second sidewall layers 15 in the A-A1 direction is not the smallest, so the second sidewall layers 15 in the A-A1 direction are not connected or contacted.

With reference to FIG. 14, the initial first vias 193 have an irregular shape from cross-sectional view, each being provided with the chamfers 194 which will be modified subsequently. In the embodiment, the initial first vias 193 are arranged in a square mode, i.e. each initial first via 193 is adjacent to four initial first vias 193. Accordingly, the first vias 195 formed subsequently are arranged in a square mode, i.e. each first via 195 is adjacent to four first vias 195. In other embodiments, the first vias 195 may also be arranged in a hexagonal mode.

In the embodiment, the material of the second sidewall layers 15 is the same as that of the first sidewall layers 13, both of which, for example, may be silicon oxide. Therefore, when the base 18 is subsequently etched with the second sidewall layers 15 and the first sidewall layers 13 as a mask, the second sidewall layers 15 and the first sidewall layers 13 have the same etching rate, thereby ensuring the same consumption degree, and further ensuring that the finally formed capacitor holes 196 (with reference to FIG. 21) are consistent in size and height.

The operations of forming the second sidewall layers 15 will be illustrated in detail below.

With reference to FIG. 12, an initial second sidewall layer 151, covering the first sidewall layers 13 and the first mask layers 14 is formed, and the initial second sidewall layer 151 is further located between adjacent first sidewall layers 13 on the base 18. In the embodiment, the initial second sidewall layer 151 may be formed by ALD process to ensure that the initial second sidewall layer 151 is in a desired shape.

With reference to FIGS. 13-14, FIG. 13 illustrates a cross-sectional diagram of FIG. 14 along the A-A1 direction. The initial second sidewall layer 151 located on the top surfaces of the first mask layers 14 and the first sidewall layers 13 and between the adjacent first sidewall layers 13 is removed (with reference to FIG. 12), and the remaining initial second sidewall layer 151 serves as the second sidewall layers 15. In the embodiment, the top surfaces of the second sidewall layers 15 are flush with the top surfaces of the first sidewall layers 13. In the embodiment, the initial second sidewall layer 151 may be etched downward by dry etching.

In the embodiment, the width of the first sidewall layers 13 is smaller than that of the second sidewall layers 15 in the direction perpendicular to the side walls of the sidewall layers 150. It should be understood that, the first sidewall layers 13 are configured to finely adjust the size of the third vias 191 (with reference to FIG. 5), to form the second vias 192 (with reference to FIG. 7) with a more precise size, therefore, the size may be adjusted more easily when the width of the first sidewall layers 13 is relatively small. The second sidewall layers 15 are configured to connect multiple first sidewall layers 13 to define the initial first vias 193, therefore, when the width of the second sidewall layers 15 is relatively large, the multiple first sidewall layers 13 may be connected as a whole more easily. In other embodiments, the width of first sidewall layers 13 may further be larger than or equal to that of second sidewall layers 15.

It should be noted that, in the embodiment, the sidewall layers 150 have a double-layer structure to improve the pattern accuracy. In other embodiments, the positions of first mask layers 14 may be defined directly by a second mask layer 12. After forming the first mask layers 14, the second mask layer 12 is removed, and the sidewall layers 150 encircling the first mask layers 14 are formed. At this time, the sidewall layers 150 have a single-layer structure.

Figure 15:
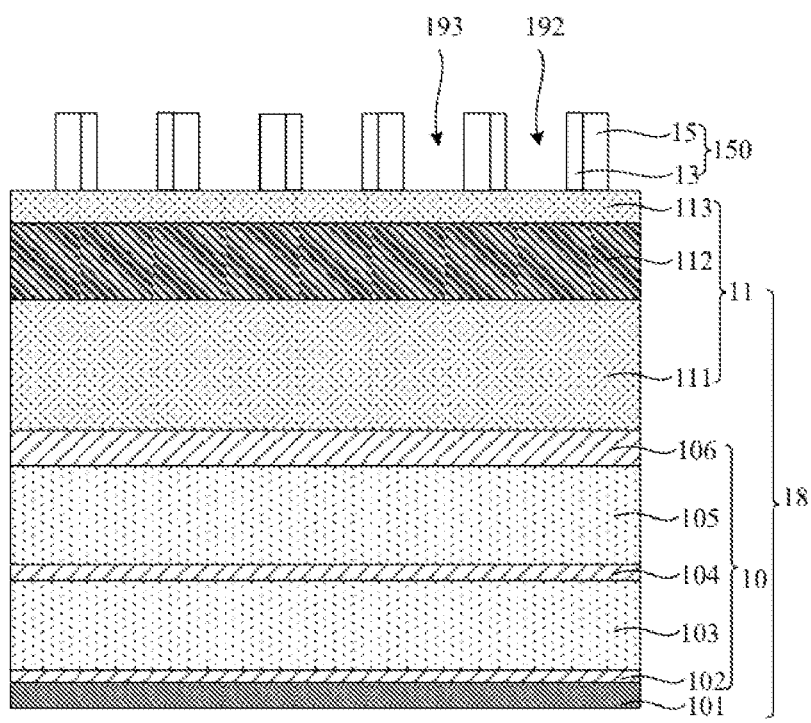
Figure 16:
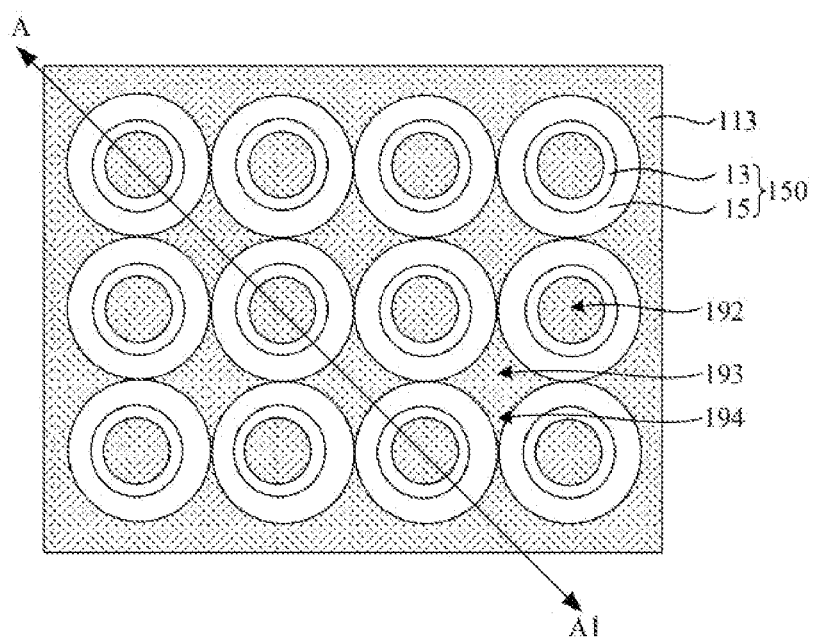

With reference to FIG. 2 and FIGS. 15-16, in which FIG. 15 illustrates a cross-sectional diagram of FIG. 16 along the A-A1 direction, at S4, the first mask layers 14 (with reference to FIG. 14) is removed, and each sidewall layer 150 defines one corresponding second via 192, i.e., the first mask layers 14 occupy spatial positions of the second vias 192, and after removing the first mask layers 14, the second vias 192 are exposed. In the embodiment, the first mask layers 14 may be removed by oxygen plasma ashing. In other embodiments, first mask layers 14 may further be removed by wet etching.

With reference to FIG. 2 and FIGS. 17-19, at S5, repair layers 16 are formed, which are located on the side walls, away from the second vias 192, of the sidewall layers 150, and thus fill the chamfers 194 of the initial first vias 193 to form the first vias 195. In the embodiment, the repair layers 16 may further be located on the side walls, facing the second vias 192, of the sidewall layers 150.

The repair layers 16 are configured to smooth the initial first vias 193 to remove the chamfers 194 (with reference to FIG. 16), and to modify the shape of the initial first vias 193, so as to form the first vias 195, therefore more smooth capacitor holes 196 may be subsequently formed. Smooth surfaces are beneficial to avoid point discharge or electric leakage of the capacitors formed subsequently, thus further improving the electrical properties of the semiconductor structure. In addition, the repair layers 16 can repair defective surfaces of the sidewall layers 150, therefore the sidewall layers 150 have a relatively good surface shape.

In the embodiment, the first vias 195 are in a circular shape from cross-sectional view. In other embodiments, the first vias 195 may further be in an elliptical shape from cross-sectional view. In the embodiment, the second vias 192 are arranged in a square mode, i.e. each second via 192 is adjacent to four second vias 192 except for the second vias 192 at the edge position. Further, each first via 195 is adjacent to four second vias 192, i.e. each first via 195 is positioned among corresponding four second vias 192. In other embodiments, each first via may also be positioned among corresponding six second vias 192.

The material of the repair layers 16 is the same as that of the sidewall layers 150. Therefore, when the base 18 is subsequently etched with the sidewall layers 150 and the repair layers 16 as a mask, the sidewall layers 150 and the repair layers 16 have the same etching rate, thereby ensuring the same consumption degree, and further ensuring that the multiple capacitor holes 196 (with reference to FIG. 21) finally formed are consistent in size and height.

The width of the repair layers 16 is smaller than that of the sidewall layers 150 in the direction perpendicular to the side walls of the sidewall layers 150. It should be understood that, the sidewall layers 150 are configured to define the positions of the second vias 192 and the initial first vias 193 (with reference to FIG. 16), therefore, the sidewall layers 150 are required to have a large width to meet the distance requirement between the first vias 195 and the corresponding second vias 192. The repair layers 16 are mainly configured to remove the chamfers 194 to adjust the shape of the initial first vias 193 and ensure that the first vias 195 and the second vias 192 have the same diameter. Therefore, the repair layers 16 with a smaller width can smooth the initial first vias 193 while occupying a smaller space, thereby reducing the influence on the size of the capacitor holes 196 (with reference to FIG. 21) formed subsequently.

Figure 17:
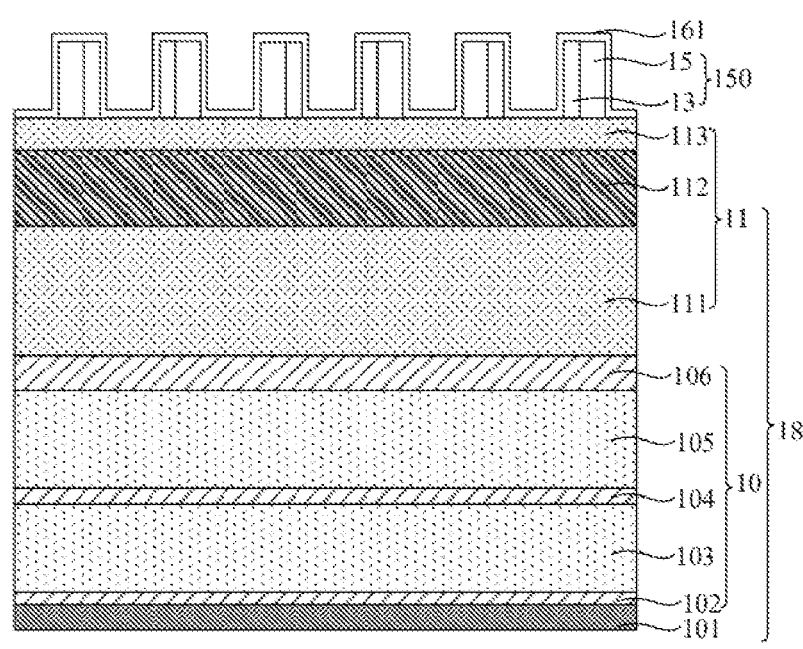

Specifically, with reference to FIG. 17 forming the repair layers 16 includes forming an initial repair layer 161, which covers the surfaces of the sidewall layers 150 and further cover the base 18 located between adjacent sidewall layers 150. In the embodiment, the initial repair layer 161 may be formed by ALD process. In other embodiments, the initial repair layer 161 may further be formed by LPCVD process.

Figure 18:
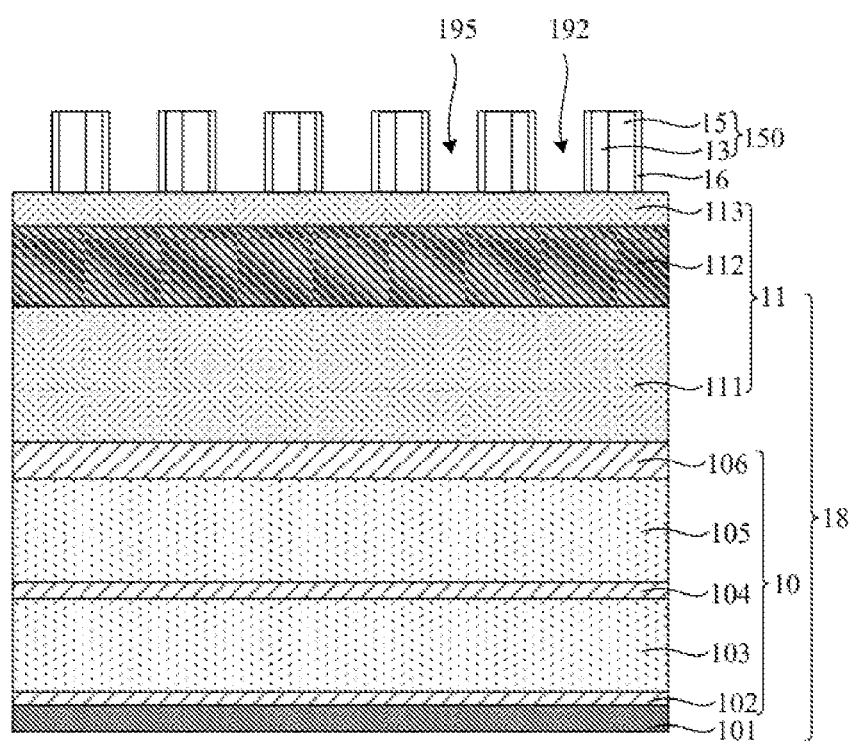
Figure 19:
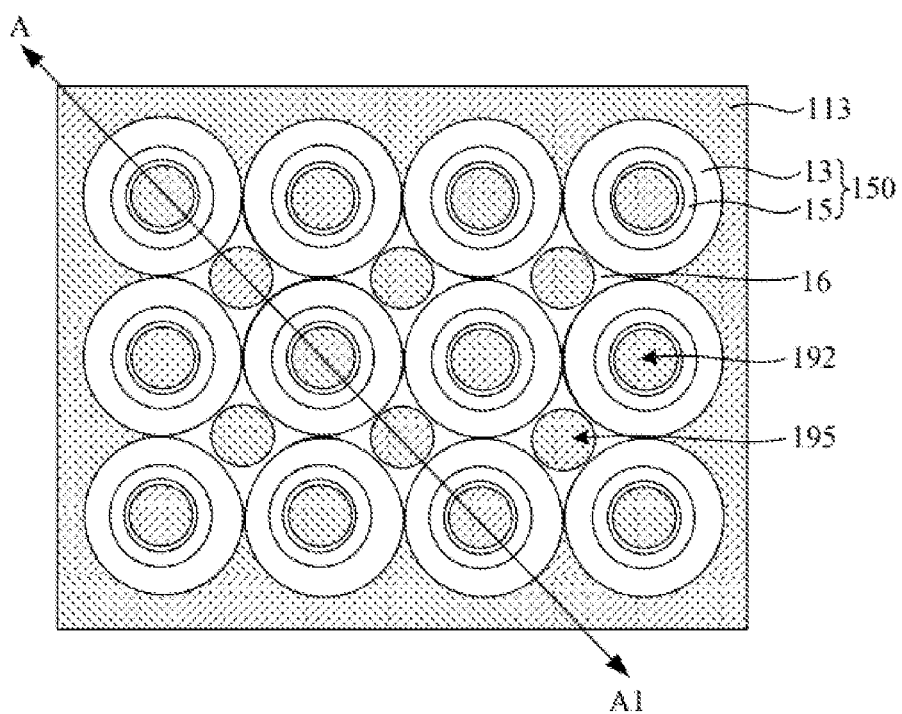

With reference to FIGS. 18-19, FIG. 18 illustrates a cross-sectional diagram along the A-A1 direction of FIG. 19. The initial repair layer 161 is etched downward (with reference to FIG. 17), the initial repair layer 161 covering the base 18 is removed, and the remaining initial repair layer 161 serves as the repair layers 16. In the embodiment, the initial repair layer 161 located on the top surfaces of the sidewall layers 150 is further removed. In the embodiment, parts of the initial repair layer 161 may be removed by dry etching.

Thereon, with the foregoing processes, a mask structure provided with the first vias 195 and the second vias 192 is formed on the surface of the third mask layer 11 through the structures of the sidewall layers 150 and the repair layers 16, and then the base 18 is etched to form the capacitor holes 196 with the sidewall layers 150 and the repair layers 16 as a mask, i.e., the positions of the first vias 195 and the second vias 192 correspond to the positions of the capacitor holes formed subsequently. From the foregoing analysis, it should be understood that the distances between the first vias 195 and the corresponding second via 192 are approximately the same as the width of the sidewall layers 150, so as to ensure that the distances between the first vias 195 and the corresponding second vias 192 may be substantially the same. Therefore, in the subsequent process of etching the base 18, the etching depths can be ensured to be approximately the same, thereby avoiding the problems of over-etching and insufficient etching. In addition, in the embodiment, the pattern of the capacitor holes 196 is not necessary to be defined by patterns of upper and lower mask layers together, but defined directly through the sidewall layers 150 and the repair layers 16 in the same layer. Furthermore, the same mask material may be adopted in the embodiment, thereby avoiding the problem of different etching degrees caused by different mask materials.

Figure 20:
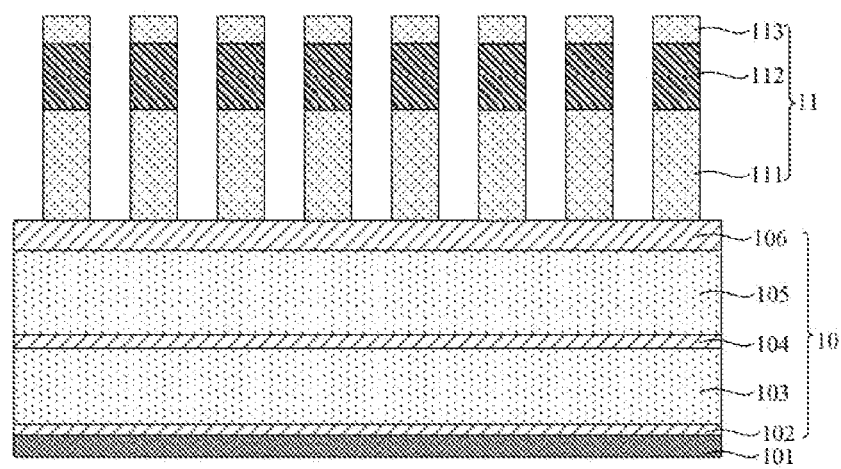
Figure 21:
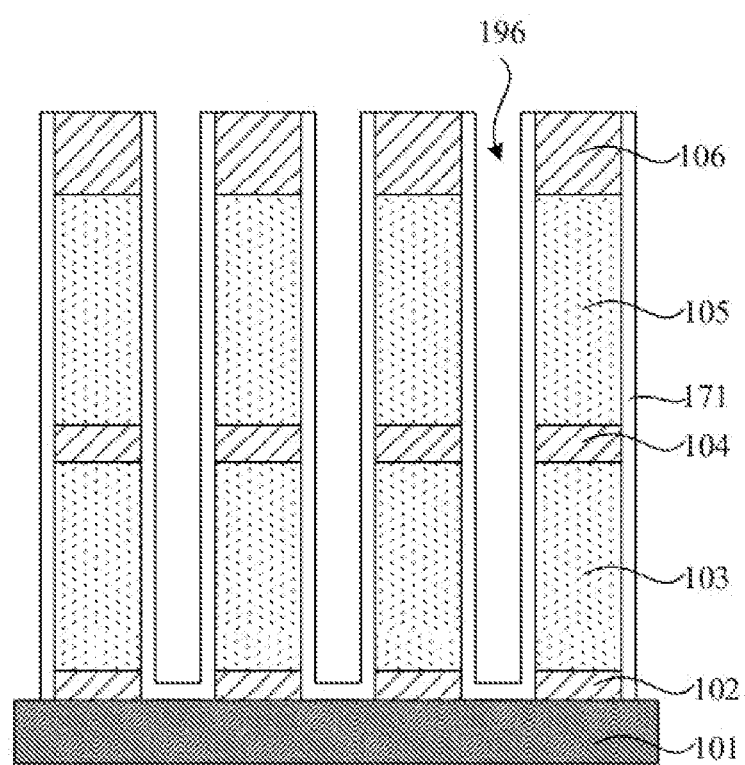

With reference to FIG. 2 and FIGS. 20-21, at S6, the base 18 is etched along the first vias 195 and second vias 192 to form the capacitor holes 196 therein. The capacitor holes 196 are the spaces occupied by the capacitors formed subsequently.

Specifically, with reference to FIG. 20, parts of the third upper layer mask layer 113 and parts of the third middle mask layer 112 are etched with the sidewall layers 150 and the repair layers 16 as a mask to pattern the third upper mask layer 113 and the third middle mask layer 112; and parts of the third lower mask layer 111 are etched with the patterned third upper mask layer 113 and the patterned third middle mask layer 112 as a mask to pattern the third lower mask layer 111. In the embodiment, dry etching may be adopted to form the patterned third upper mask layer 113, the patterned third middle mask layer 112 and the patterned third lower mask layer 111.

With reference to FIG. 21, the isolation layer 10 is etched with the patterned third lower mask layer 111 as a mask to form the capacitor holes 196. Specifically, the capacitor holes 196 penetrate through the bottom support layer 102, the first sacrificial layer 103, the intermediate support layer 104, the second sacrificial layer 105 and the top support layer 106.

After forming the capacitor holes 196, the method further includes: forming lower electrodes 171, which are located at the bottoms and side walls of the capacitor holes 196.

In the embodiment, the lower electrodes 171 may be formed by PVD process, and the material of the lower electrodes 171 may be titanium nitride, copper, tungsten or tantalum nitride. According to the foregoing illustration, the capacitor holes 196 are consistent in size and height, and therefore the lower electrodes 171 deposited on the side walls of the capacitor holes 196 can also be consistent in size and height.

Figure 22:
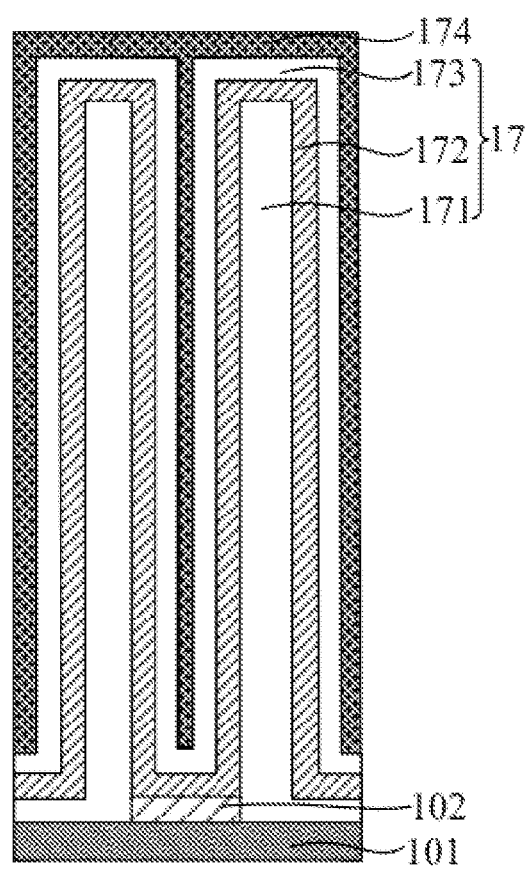

With reference to FIG. 22, FIG. 22 illustrates an enlarged partial structural diagram of the capacitors. After forming the lower electrodes 171, the method further includes the following operations: parts of the top support layer 106 and parts of the intermediate support layer 104 are removed, and the first sacrificial layer 103 and the second sacrificial layer 105 are removed to expose the lower electrodes 171; a dielectric layer 172 covering the surfaces of the lower electrodes 171 is formed; a upper electrode 173 covering the dielectric layer 172 is formed; the upper electrode 173, the lower electrodes 171 and the dielectric layer 172 are configured to form the capacitors 17; and a cover layer 174 is formed on the surface of the upper electrode 173.

The material of the dielectric layer 172 may be a material with high dielectric constant, such as tantalum oxide, hafnium oxide, zirconium oxide, niobium oxide, titanium oxide, barium oxide, strontium oxide, yttrium oxide, lanthanum oxide, praseodymium oxide, strontium barium titanate or the like. In the embodiment, the material of the upper electrode 173 may be the same as that of the lower electrodes 171. In other embodiments, the material of the upper electrode may also be different from that of the lower electrodes. The hardness of the cover layer 174 is large, and the firmness of the capacitors 17 can be improved. For example, the material of the cover layer 174 may be polysilicon or germanium silicon.

According to the foregoing illustration, the capacitor holes 196 are consistent in size and height, therefore, the formed capacitors 17 are also consistent in size and height, thereby avoiding the problem of reduced storage capacity or electrical failure of the capacitors 17.

In summary, in the embodiment, the sidewall layers 150 are configured to define the positions of both the first vias 195 and the second vias 192, therefore the distances between the first vias 195 and the corresponding second vias 192 are approximate to the width of the sidewall layers 150, in this way, the distances between the first vias 195 and the corresponding second vias 192 can be kept relatively consistent. In addition, the material of the sidewall layers 150 and that of the repair layers 16 are the same, therefore the etching rates of the sidewall layers 150 and the repair layers 16 can be kept consistent, thereby avoiding the problem of over-etching or insufficient etching during etching the base 18. Furthermore, the repair layers 16 may further configured to remove the chamfers of the initial first vias 193 to form relatively smooth first vias 195, and then form smooth capacitor holes 196, which is beneficial to avoid the phenomenon of point discharge or electric leakage. Therefore, the method according to the embodiment of the disclosure can ensure the consistency of the capacitor holes 196 in size and height, and ensure a high aspect ratio of the capacitor holes 196 as well, thereby improving the quality of the capacitors 17, and further improving the yield of the semiconductor structure.

Those of ordinary skill in the art should understand that the foregoing embodiments are specific embodiments for implementing the disclosure, and in practical application, variations may be made in terms of form and detail thereof without departing from the spirit and scope of the disclosure. Any person skilled in the art may make variations and modifications without departing from the spirit and scope of the disclosure, therefore the scope of the disclosure should be defined by the scope of the claims.

The invention claimed is:

1. A method for manufacturing a semiconductor structure, comprising:
   providing a base;
   forming multiple discrete first mask layers on the base;
   forming multiple sidewall layers, wherein each sidewall layer is configured to encircle one of the first mask layers, each sidewall layer is connected to closest sidewall layers, side walls, away from the first mask layers, of the multiple connected sidewall layers define initial first vias, and each of the initial first vias is provided with chamfers;
   removing the first mask layers, wherein each sidewall layer defines a second via;
   forming repair layers, after removing the first mask layers, wherein the repair layers are located on side walls, away from the second vias, of the sidewall layers; and the repair layers fill the chamfers of the initial first vias to form first vias; and
   etching the base along the first vias and the second vias to form capacitor holes located in the base.

2. The method for manufacturing the semiconductor structure of claim 1, wherein, the first vias are arranged in a square mode, the second vias are arranged in a square mode, and each first via is adjacent to four second vias.

3. The method for manufacturing the semiconductor structure of claim 1, wherein, a material of the repair layers is the same as a material of the sidewall layers.

4. The method for manufacturing the semiconductor structure of claim 1, wherein, a width of the repair layers is smaller than a width of the sidewall layers in a direction perpendicular to the side walls of the sidewall layers.

5. The method for manufacturing the semiconductor structure of claim 1, wherein, forming the repair layers comprises:
   forming an initial repair layer, which covers surfaces of the sidewall layers and further covers the base between adjacent sidewall layers; and
   removing the initial repair layer covering the base, the remaining initial repair layer serving as the repair layers.

6. The method for manufacturing the semiconductor structure of claim 5, wherein, a process for forming the initial repair layer comprises an ALD process.

7. The method for manufacturing the semiconductor structure of claim 1, wherein, the base comprises an isolation layer and a third mask layer which are stacked, in which the third mask layer has a multi-layer structure, comprising a third lower mask layer, a third middle mask layer and a third upper mask layer which are stacked; and
   forming the capacitor holes comprises:
      etching parts of the third upper mask layer and parts of the third middle mask layer to form a patterned third upper mask layer and a patterned third middle mask layer with the sidewall layers and the repair layers as a mask; and etching parts of the third lower mask layer with the patterned third upper mask layer and the patterned third middle mask layer as a mask to form a patterned third lower mask layer; and
      etching the isolation layer with the patterned third lower mask layer as a mask to form the capacitor holes.

8. The method for manufacturing the semiconductor structure of claim 7, further comprising: after forming the capacitor holes, forming lower electrodes, which are located at bottoms and on side walls of the capacitor holes.

9. The method for manufacturing the semiconductor structure of claim 8, wherein, the isolation layer comprises: a bottom support layer, a first sacrificial layer, an intermediate support layer, a second sacrificial layer and a top support layer which are stacked; and
   the capacitor holes penetrate through the bottom support layer, the first sacrificial layer, the intermediate support layer, the second sacrificial layer and the top support layer; and
   after forming the lower electrodes, the method further comprises: removing parts of the top support layer and parts of the intermediate support layer, and removing the first sacrificial layer and the second sacrificial layer, so as to expose the lower electrodes;
   forming a dielectric layer covering surfaces of the lower electrodes;
   forming an upper electrode covering the dielectric layer, wherein the upper electrode, the lower electrodes and the dielectric layer are configured to form capacitors; and
   forming a cover layer located on a surface of the upper electrode.

10. The method for manufacturing the semiconductor structure of claim 1, wherein, forming the first mask layers and the sidewall layers comprises:
    forming a second mask layer on the base, wherein the second mask layer is provided with multiple discrete third vias;
    forming first sidewall layers on side walls of the third vias, wherein the first sidewall layers define the second vias;
    after forming the first sidewall layers, removing the second mask layer;
    after removing the second mask layer, forming the first mask layers filling the second vias; and
    after forming the first mask layers, forming second sidewall layers on the side walls, away from the first mask layers, of the first sidewall layers, wherein each second sidewall layer is connected to closest second sidewall layers, and the side walls, away from the first mask layers, of the multiple connected second sidewall layers define the initial first vias; and the first sidewall layers and the second sidewall layers constitute the sidewall layers.

11. The method for manufacturing the semiconductor structure of claim 10, wherein, a material of the first mask layers comprises photoresist, and a process of forming the first mask layers comprises:
    forming a photoresist layer, which is located between adjacent first sidewall layers and fully filling the second vias; and
    performing exposure treatment and development treatment on the photoresist layer to remove the photoresist layer located between the adjacent first sidewall layers, and the remaining photoresist layer located in the second vias being configured as the first mask layers.

12. The method for manufacturing the semiconductor structure of claim 10, wherein, a material of the first sidewall layers is the same as a material of the second sidewall layers.

13. The method for manufacturing the semiconductor structure of claim 10, wherein, a width of the first sidewall layers is smaller than a width of the second sidewall layers in a direction perpendicular to the side walls of the sidewall layers.

14. The method for manufacturing the semiconductor structure of claim 10, wherein, forming the first sidewall layers comprises:

forming an initial first sidewall layer, which is located on side walls and bottoms of the third vias and a top surface of the second mask layer; and removing the initial first sidewall layer located on the top surface of the second mask layer and at the bottoms of the third vias, the remaining initial first sidewall layer serving as the first sidewall layers.

15. The method for manufacturing the semiconductor structure of claim 14, wherein, a process for forming the initial first sidewall layer comprised an atomic layer deposition (ALD) process.

* * * * *